United States Patent
Burgess et al.

(10) Patent No.: US 11,799,436 B2
(45) Date of Patent: Oct. 24, 2023

(54) METHOD OF FORMING AN INTEGRATED RESONATOR WITH A MASS BIAS

(71) Applicant: TEXAS INSTRUMENTS INCORPORATED, Dallas, TX (US)

(72) Inventors: Byron Neville Burgess, Allen, TX (US); William Robert Krenik, Garland, TX (US); Stuart M. Jacobsen, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 809 days.

(21) Appl. No.: 16/551,757

(22) Filed: Aug. 27, 2019

(65) Prior Publication Data

US 2019/0386627 A1 Dec. 19, 2019

Related U.S. Application Data

(60) Continuation of application No. 14/970,676, filed on Dec. 16, 2015, now Pat. No. 10,396,746, which is a
(Continued)

(51) Int. Cl.
*H03H 3/04* (2006.01)
*H03H 9/10* (2006.01)
(Continued)

(52) U.S. Cl.
CPC ............... *H03H 3/02* (2013.01); *H03H 3/04* (2013.01); *H03H 9/02102* (2013.01);
(Continued)

(58) Field of Classification Search
CPC ...... H03H 3/02; H03H 3/04; H03H 2003/023; H03H 2003/027; H03H 9/0542;
(Continued)

(56) References Cited

U.S. PATENT DOCUMENTS

| 5,474,958 A | 12/1995 | Djennas et al. |
| 6,087,198 A | 7/2000 | Panasik |

(Continued)

FOREIGN PATENT DOCUMENTS

| JP | 2001089236 A | 4/2001 |
| JP | 2002278558 A | 9/2002 |

(Continued)

OTHER PUBLICATIONS

J. Wang, R. Wu, W. Zhao, J. Du and D. Huang, "Correction Factors for Mindlin Higher-order Plate Theory with the Consideration of Electrodes," 2007 IEEE International Frequency Control Symposium Joint with the 21st European Frequency and Time Forum, 2007, pp. 203-207, doi: 10.1109/FREQ.2007.4319064. (Year: 2007).*

(Continued)

*Primary Examiner* — A. Dexter Tugbang
(74) *Attorney, Agent, or Firm* — Andrew R. Ralston; Frank D. Cimino

(57) ABSTRACT

A method of forming a resonator includes forming top and bottom dielectric structures over a substrate. A piezoelectric layer is formed between the top and bottom dielectric structures. A bottom electrode is formed between the piezoelectric layer and the bottom dielectric structure, and a top electrode is formed between the piezoelectric layer and the top dielectric structure. A metal layer is formed over the top dielectric structure and is patterned, thereby forming a first contact pad making electrical contact to the top electrode, a second contact pad making electrical contact with the bottom electrode, and a mass bias located over the top dielectric structure.

20 Claims, 2 Drawing Sheets

Related U.S. Application Data division of application No. 13/484,931, filed on May 31, 2012, now Pat. No. 9,246,467.

(51) Int. Cl.
   *H03H 3/02* (2006.01)
   *H03H 9/02* (2006.01)
   *H03H 9/17* (2006.01)
   *H01L 23/498* (2006.01)
   *H01L 23/31* (2006.01)
   *H03H 9/05* (2006.01)

(52) U.S. Cl.
   CPC ...... *H03H 9/02149* (2013.01); *H03H 9/1007* (2013.01); *H03H 9/1057* (2013.01); *H03H 9/175* (2013.01); *H01L 23/3107* (2013.01); *H01L 23/3171* (2013.01); *H01L 23/49838* (2013.01); *H03H 9/0542* (2013.01); *H03H 2003/023* (2013.01); *H03H 2003/027* (2013.01); *Y10T 29/42* (2015.01); *Y10T 29/49171* (2015.01); *Y10T 29/49172* (2015.01)

(58) Field of Classification Search
   CPC ........... H03H 9/02102; H03H 9/02149; H03H 9/1007; H03H 9/1057; H03H 9/175; Y10T 29/42; Y10T 29/49171; Y10T 29/49712; H01L 23/3107; H01L 23/3171; H01L 23/49838
   See application file for complete search history.

(56) References Cited

U.S. PATENT DOCUMENTS

| | | | |
|---|---|---|---|
| 6,232,150 B1 | 5/2001 | Lin et al. | |
| 6,362,525 B1 | 3/2002 | Rahim | |
| 6,466,105 B1 | 10/2002 | Lobl | |
| 6,509,813 B2 | 1/2003 | Ella et al. | |
| 6,548,942 B1 | 4/2003 | Panasik | |
| 6,933,807 B2 | 8/2005 | Marksteiner et al. | |
| 6,998,940 B2 | 2/2006 | Metzger | |
| 7,094,678 B2 | 8/2006 | Bradley | |
| 7,358,831 B2 | 4/2008 | Larson, III et al. | |
| 7,385,334 B1 | 6/2008 | Olsson et al. | |
| 7,463,118 B2 | 12/2008 | Jacobsen | |
| 7,489,067 B2 | 2/2009 | Metzger et al. | |
| 7,795,728 B2 * | 9/2010 | Przadka | H03H 9/0542 361/811 |
| 8,601,655 B2 | 12/2013 | Barber et al. | |
| 2004/0021529 A1 | 2/2004 | Bradley et al. | |
| 2006/0186525 A1 | 8/2006 | Theuss et al. | |
| 2008/0042524 A1* | 2/2008 | Shibata | H03H 3/04 29/25.35 |
| 2010/0187948 A1 | 6/2010 | Sinha et al. | |
| 2010/0295631 A1 | 11/2010 | Coudrain et al. | |
| 2011/0078894 A1 | 4/2011 | Bar et al. | |
| 2011/0080233 A1 | 4/2011 | Petit et al. | |
| 2011/0304412 A1 | 12/2011 | Zhang | |
| 2012/0013224 A1 | 1/2012 | Sinha et al. | |
| 2012/0079692 A1 | 4/2012 | Sinha et al. | |
| 2012/0164753 A1 | 6/2012 | Johnston et al. | |
| 2013/0049545 A1 | 2/2013 | Zou et al. | |
| 2013/0300259 A1 | 11/2013 | Sinha et al. | |
| 2014/0225683 A1 | 8/2014 | Burak et al. | |

FOREIGN PATENT DOCUMENTS

| | | | |
|---|---|---|---|
| JP | 2006523051 A | 10/2006 | |
| JP | 2009200714 A * | 9/2009 | ......... H03H 9/02118 |

OTHER PUBLICATIONS

Machine Translation (in English) of Japanese Patent Publication, JP 2009-200714. (Year: 2023).*

* cited by examiner

METHOD OF FORMING AN INTEGRATED RESONATOR WITH A MASS BIAS

CROSS-REFERENCE TO RELATED APPLICATION

This application is a divisional of nonprovisional U.S. patent application Ser. No. 13/484,931, filed May 31, 2012, and to U.S. patent application Ser. No. 14/970,676, filed Dec. 16, 2015 and issued as U.S. Pat. No. 10,396,746, the contents of both being herein incorporated by reference in their entireties.

BACKGROUND

Timing solutions are important in modern electronics. Used in almost all commercial and consumer equipment, timing devices provide frequency control and timing for many applications. Crystal oscillators have been the predominant type of frequency generators for decades. Crystal oscillators typically use a piece of quartz which results in a fairly large device compared to the integrated circuits the crystal oscillator may be used to control. It is desirable for the oscillator frequency to be stable and not drift.

SUMMARY

An integrated resonator is disclosed that includes a mass bias on top of the resonator and within the plastic packaging. The added mass functions to prevent or at least reduce frequency drift over time of the resonator device.

Various examples provide a method of forming a resonator that includes forming top and bottom dielectric structures over a substrate. A piezoelectric layer is formed between the top and bottom dielectric structures. A bottom electrode is formed between the piezoelectric layer and the bottom dielectric structure, and a top electrode is formed between the piezoelectric layer and the top dielectric structure. A metal layer is formed over the top dielectric structure and is patterned, thereby forming a first contact pad making electrical contact to the top electrode, a second contact pad making electrical contact with the bottom electrode, and a mass bias located over the top dielectric structure.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The term "about" or "approximately" means plus or minus 10%.

Figure 1:
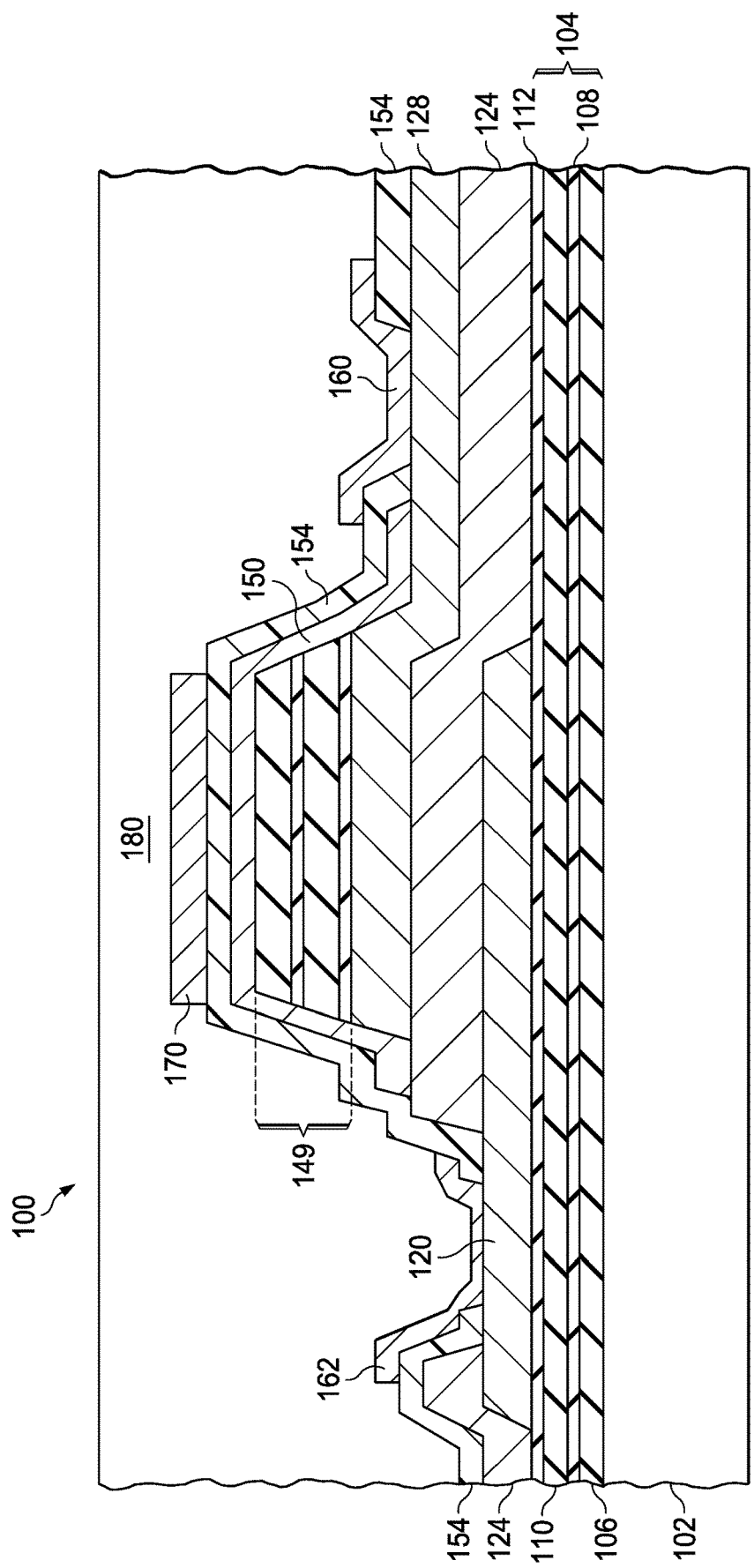
FIG. 1 shows a cross-section of an integrated piezoelectric resonator with a mass bias in accordance with various embodiments of the invention.

FIG. 1 illustrates a cross-section of a temperature-controlled integrated piezoelectric resonator device 100 that includes a suitable substrate such as a single crystal silicon wafer 102. On the substrate, an acoustic reflector 104 (such as an acoustic Bragg reflector) preferably is formed. The acoustic Bragg reflector 104 may comprise alternating layers of higher acoustic impedance and lower acoustic impedance.

In the example of FIG. 1, a first layer 106 of high acoustic impedance material is deposited followed by a subsequent layer 108 of low acoustic impedance material. Additional layers 110 and 112 of high and low acoustic impedance material, respectively, are also deposited. Thus, layers 106 and 110 are high acoustic impedance material, and preferably the same material. Similarly, layers 108 and 112 are low acoustic impedance material, and preferably the same material.

In one example, the lower acoustic impedance material may be a dielectric such as nanoporous spin-on-glasses of nanoporous hydrogen-silsesquioxane (HSQ) or nanoporous methyl-silsesquioxane (MSQ) which may be deposited in a spin coater with a subsequent curing step.

The higher acoustic impedance material may be a dielectric such as comprise silicon carbide (SIC). If SiC is used as the higher impedance material, it may be deposited, in one example, in a plasma chemical vapor deposition (CVD) deposition chamber using source gases such as a mixture of methane ($CH_4$) and silane. If diamond-like-carbon (DLC) or Si-DLC is used, instead of SiC, then a modified deposition chamber is employed. DLC is deposited, for example, in a 150 mm parallel plate reactor RFCVD chamber with the upper plate being the gas distribution source and the lower plate being the cathode on which the substrate lies. In this configuration, the upper plate is positive and the cathode is negative (grounded). An RF source (e.g., 13.56 MHz) may be coupled directly to the substrate through the cathode. After the chamber is evacuated, any hydrocarbon gas, such as $CH_4$, and/or a Si containing hydrocarbon forming gas if Si-doping is required (e.g., tetramethyldisiloxane (4MS)), is introduced into the chamber until the desired pressure is achieved and flow is stable. Other gases such as argon (Ar) and hydrogen ($H_2$) can be used in addition to the hydrocarbon forming gases to control the chemical composition of the final DLC film. At this point power is delivered to the cathode to strike a plasma and DLC is deposited for a fixed amount of time until the desired thickness is achieved. Next the power is shut off and the chamber is vented using an inert gas (Ar, N$_2$, etc.) until ambient pressure is reached and the DLC deposited substrate is removed. Variables that affect DLC physical properties may include: RF power, pressure, total gas flow, different gas ratios and cathode to upper plate spacing. Prior to DLC deposition, an argon plasma may be used to pre-condition the substrate surface for the deposition for 1-2 minutes. DLC deposition may be done at ambient temperatures. DLC thickness and the index of refraction can be measured directly using, for example, a pre-calibrated ellipsometer.

In one example, the thickness of the individual layers of the acoustic Bragg reflector 104 is chosen to be equal to one-quarter wavelength of the resonant frequency of the device. Once the acoustic Bragg reflector 104 is complete the next step is to deposit the first resonator electrode 120. In one embodiment, the resonator electrode 120 is sputter deposited, and the material for the electrode is molybdenum (Mo), although other materials are possible as well such as titanium (Ti), tungsten (W), gold (Au), platinum (Pt) or aluminum (Al). In one example, the material for the resonator electrode may have a low thermoelastic loss and may have a thickness of less than about 1000 Å in order to maintain a smooth surface.

After the first resonator electrode 120 has been deposited, a piezoelectric layer 124 is deposited. A suitable material for the piezoelectric layer 124 can be aluminum nitride (AlN) although other materials are possible as well such as zinc oxide (ZnO) and lead zirconate titanate (PZT). In one example the AlN layer is reactively sputter deposited with nitrogen gas using an optimized process yielding a low stress, dense layer with a c-axis orientation. The thickness of the piezoelectric layer 124 may be in the range from about 0.1 to about 10 microns.

An upper electrode 128 is deposited to complete the resonator. Again, the top electrode may be a sputter deposited layer of Mo. A top Bragg reflector 149 is also included and is the same or similar in construction to the lower Bragg reflector 104. Contact pads 160 and 162 are provided for external connection to the device. Contact pad 160 provides electrical contact to the upper electrode 128, and contact pad 162 provides electrical contact to the lower electrode 128. The device 100 may have a protective overcoat 154 such as silicon nitride or silicon oxide.

In accordance with the preferred embodiments of the invention, a mass bias 170 is also included as is formed over the upper Bragg reflector 149 and on a side opposite of the upper reflector opposite the piezoelectric layer 124. Plastic mold fill 180 then is formed thereby encapsulating the mass bias 170, acoustic Bragg reflector, and piezoelectric resonator. The mass bias functions to prevent or at least reduce frequency drift over time of the resonator device. Without the mass bias 170, the frequency of the device may shift over time due to accumulation of mass (e.g., outgassing material, particles, etc.) over time on top of the piezoelectric resonator. By preloading the resonator with a known mass (mass bias 10) and tuning in the frequency with this mass already sitting on top of the resonator at time zero, any shifts due to additional new mass accumulations in the field will be dampened. Thus, the resonator is designed for a specific frequency assuming the mass bias 170 is in place. Without the mass bias, the frequency would be different (e.g., higher).

In at least some embodiments, the mass bias 170 is deposited at the same time that the contact points 160 and 162 are formed and thus mass bias 170 is formed from the same material as contact points 160 and 162. In embodiments in which contact points are formed from aluminum copper (AlCu), mass bias 170 also is formed from AlCu. The mass bias 170 may be approximately 1 micron thick As described above, the device 100 preferably comprises a substrate 102, an acoustic Bragg reflector 104, a resonator (including electrodes 120 and 128 on opposing sides of piezoelectric layer 124), and a mass bias.

The device 100 may also include a temperature-controlled feature. In the embodiment of FIG. 1, an active heater layer 150 also is provided. The active heater layer 150 preferably comprises a tantalum aluminum alloy thin film, or other suitable material. The layer 150 may have a thickness of about 1000 Å. At that thickness, the sheet resistance of the heater is about 30 ohms/square. The ratio of tantalum to aluminum in the heater layer may be about 50:50.

The active heater layer 150 is integrated into device 100 and is on top of and surrounds some, or all, of the upper electrode 128 and thus the resonator in general. An electrical current can be provided to the active heater layer 150 via contacts (not shown). The amount of heat produced by the active heater layer is controllable by the amount of current provided to the heater layer—higher current levels cause the heater layer 150 to generate higher levels of heat. Such a heater layer provides an overall oven controlled resonator structure that raises the temperature for the device 100 above the highest ambient temperature specification for the device. By forcing the temperature to a known and stable level, temperature variation is minimized or eliminated and thus temperature-induced variations in the device's frequency are avoided or at least reduced.

Figure 2:
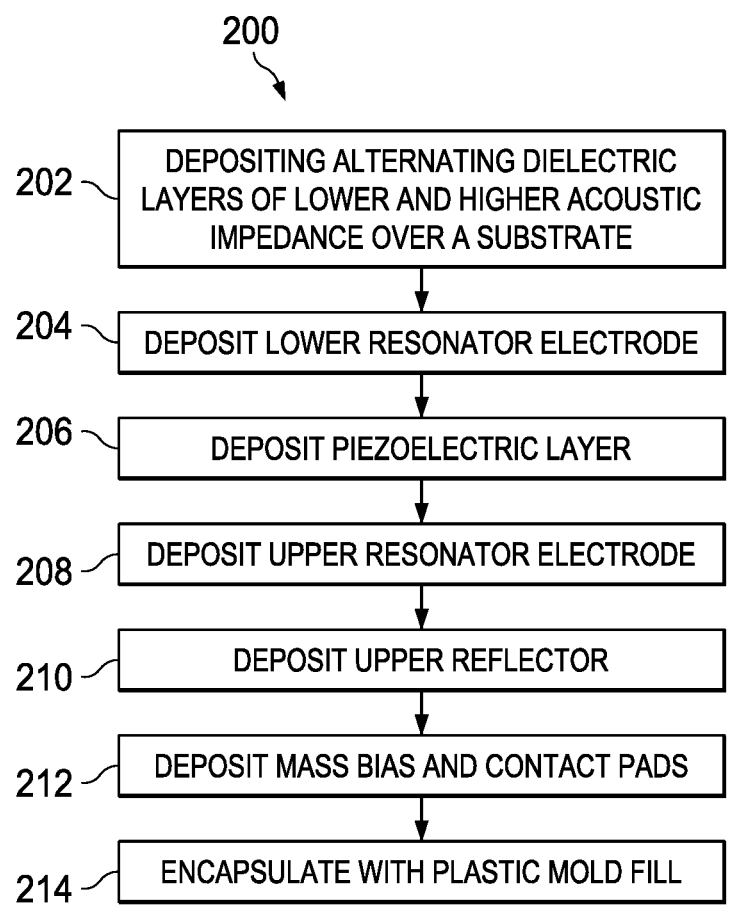
FIG. 2 shows a method of fabricating the integrated piezoelectric resonator in accordance with various embodiments.

FIG. 2 illustrates a method 200 in accordance with various embodiments to make, for example, the integrated piezoelectric resonator device 100 or other types of piezoelectric-based resonators with all dielectric Bragg reflectors. The steps of method 200 may be performed in the order shown or possibly in a different order. Further, two or more of the steps may be performed in parallel rather than serially.

At 202, the method comprises depositing alternating dielectric layers of lower and higher acoustic impedance over a substrate (e.g., substrate 102). The substrate may be formed out of silicon such as a single silicon wafer, GaAs, AlAs, and the like. The lower and higher acoustic impedance layers may be formed materials such as that described above.

After formation of the various layers of the Bragg reflector, at 204 the lower resonator electrode 120 is formed over the Bragg reflector. In one example, the material selected for the lower resonator electrode preferably has a low thermoelastic loss and preferably has a thickness of less than 1000 Å in order to maintain a smooth resonator electrode surface. The upper electrode may be sputter deposited using materials such as molybdenum, titanium, tungsten, gold, platinum, aluminum, etc.

At 206, the piezoelectric layer is then deposited over the lower electrode. The piezoelectric layer may be formed from any suitable material such as aluminum nitride, zinc oxide, lead zirconate titanate, quartz, barium titanate, and the like. The aluminum nitride layer can be reactively sputter deposited with nitrogen gas using an optimized process yielding a low stress, dense layer employing a c-axis orientation.

An upper electrode is then deposited (208) as shown in FIG. 2. The upper electrode also can be a sputter deposited layer of molybdenum. An upper Bragg reflector 149 may also be included.

The heater layer is deposited over the piezoelectric resonator as indicated at 210. The heater layer may comprise a tantalum aluminum alloy thin film and be formed by a semiconductor deposition/photo/dry etch process which would subsequently pattern the thin film.

At 212, the mass bias 170 and contact pads 160, 162 are deposited as explained above. Finally, at 214 the device is encapsulated with a plastic mold fill.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method of forming a resonator, comprising:
   forming a bottom dielectric structure over a substrate;
   forming a top dielectric structure over the substrate;
   forming a piezoelectric layer between the top and bottom dielectric structures;
   forming a bottom electrode between the piezoelectric layer and the bottom dielectric structure;
   forming a top electrode between the piezoelectric layer and the top dielectric structure;
   forming a metal layer over the top dielectric structure; and
   patterning the metal layer thereby forming a first contact pad making electrical contact to the top electrode, a second contact pad making electrical contact with the bottom electrode, and a mass bias located over the top dielectric structure.

2. The method of claim 1, wherein the bottom dielectric structure and the top dielectric structure each include alternating layers of different dielectric materials.

3. The method of claim 2, wherein the alternating layers of different dielectric materials include one or more layers a lower acoustic impedance material and one or more layers of a higher acoustic impedance material.

4. The method of claim 2, wherein the alternating layers of different dielectric materials include one or more layers of a silsesquioxane-based material and one or more layers of silicon carbide or diamond-like carbon.

5. The method of claim 1 wherein the metal layer comprises aluminum copper (AlCu).

6. The method of claim 1 wherein a plastic mold fill overlies the mass bias.

7. The method of claim 1, further comprising encapsulating the mass bias, first and second electrodes, piezoelectric layer, and top and bottom dielectric structures with a plastic.

8. The method of claim 1 wherein the mass bias is approximately 1 µm thick.

9. The method of claim 1 wherein the bottom electrode touches a lower acoustic impedance material and the piezoelectric layer.

10. The method of claim 1 wherein the top electrode touches a lower acoustic impedance material and the piezoelectric layer.

11. The method of claim 1, further comprising forming an overcoat layer between the second set of alternating dielectric layers and the mass bias.

12. The method of claim 1, further comprising forming an active heater layer between the top dielectric structure and the mass bias.

13. The method of claim 1 wherein the bottom electrode touches a first instance of a lower acoustic impedance material and the piezoelectric layer, and the top electrode touches a second instance of the lower acoustic impedance material and the piezoelectric layer.

14. A method of forming a resonator, comprising:
    forming a piezoelectric layer over a substrate;
    forming a dielectric structure over the piezoelectric layer;
    forming a bottom electrode between the piezoelectric layer and the substrate;
    forming a top electrode between the piezoelectric layer and the dielectric structure;
    forming a metal layer over the dielectric structure; and
    patterning the metal layer therefrom forming a mass bias located over the piezoelectric layer and at least one contact pad electrically connected to the top electrode or the bottom electrode.

15. The method of claim 14, wherein the dielectric structure includes alternating layers of different dielectric materials.

16. The method of claim 15, wherein the alternating layers of different dielectric materials include one or more layers of hydrogen-silsesquioxane or methyl-silsesquioxane and one or more layers of silicon carbide or diamond-like carbon.

17. The method of claim 14 wherein the metal layer metal layer comprises aluminum.

18. The method of claim 14 wherein the mass bias is located between a plastic mold fill and the top electrode.

19. The method of claim 14, further comprising encapsulating the mass bias, top and bottom electrodes, piezoelectric layer, and dielectric structure with a plastic.

20. A method of forming a resonator, comprising:
    forming first and second electrode layers over a substrate;
    forming a piezoelectric layer between the first and second electrode layers;
    forming a metal layer over the second electrode layer; and
    patterning the metal layer thereby forming a mass bias located over the piezoelectric layer and at least one contact pad electrically connected to the first electrode or the second electrode.

* * * * *